United States Patent
Hsieh

(10) Patent No.: US 10,327,334 B1
(45) Date of Patent: Jun. 18, 2019

(54) LAYOUT STRUCTURE OF FLEXIBLE CIRCUIT BOARD

(71) Applicant: CHIPBOND TECHNOLOGY CORPORATION, Hsinchu (TW)

(72) Inventor: Chin-Tang Hsieh, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 16/038,436

(22) Filed: Jul. 18, 2018

(30) Foreign Application Priority Data

Mar. 12, 2018 (TW) .............................. 107108191 A

(51) Int. Cl.
*H05K 1/00* (2006.01)
*H05K 1/11* (2006.01)
*H05K 1/18* (2006.01)

(52) U.S. Cl.
CPC ............ *H05K 1/118* (2013.01); *H05K 1/189* (2013.01); *H05K 2201/0367* (2013.01); *H05K 2201/09009* (2013.01); *H05K 2201/10386* (2013.01)

(58) Field of Classification Search
None
See application file for complete search history.

(56) References Cited

U.S. PATENT DOCUMENTS

| | | | | |
|---|---|---|---|---|
| 5,781,022 A | * | 7/1998 | Wood | G01R 1/0466 257/E21.509 |
| 5,959,354 A | * | 9/1999 | Smith | H01L 21/4839 257/202 |
| 2003/0085054 A1 | * | 5/2003 | Ames | H01R 12/592 174/254 |
| 2005/0242160 A1 | * | 11/2005 | Nippa | B23K 1/0008 228/180.21 |
| 2009/0115054 A1 | * | 5/2009 | Hashimoto | H01L 24/11 257/737 |
| 2014/0268594 A1 | * | 9/2014 | Wang | H05K 1/183 361/749 |
| 2015/0201500 A1 | * | 7/2015 | Shinar | H05K 3/125 425/132 |

(Continued)

FOREIGN PATENT DOCUMENTS

| | | |
|---|---|---|
| JP | 63-096934 A | 4/1988 |
| JP | 2000-286309 A | 10/2000 |

(Continued)

OTHER PUBLICATIONS

Taiwanese Office Action dated Oct. 5, 2018 for Taiwanese Patent Application No. 107108191, 3 pages.

(Continued)

*Primary Examiner* — Truc T Nguyen
(74) *Attorney, Agent, or Firm* — Jackson IPG PLLC; Demian K. Jackson

(57) ABSTRACT

A layout structure of flexible circuit board includes a flexible substrate and leads formed on a surface of the flexible substrate. Each of the leads has a bump connection end and a curved part. The bump connection end of each of the leads is located on a chip disposition area of the surface and electrically connected to a chip. The curved part has a first connection point and a second connection point, and the length of the curved part is longer than a straight-line distance between the first and second connection points.

12 Claims, 4 Drawing Sheets

(56) References Cited

U.S. PATENT DOCUMENTS

| | | | | |
|---|---|---|---|---|
| 2016/0066409 A1* | 3/2016 | Kwon | ................... | H05K 1/028 |
| | | | | 174/254 |
| 2016/0079336 A1 | 3/2016 | Youn et al. | | |
| 2018/0233436 A1* | 8/2018 | Lee | ...................... | G01R 31/024 |

FOREIGN PATENT DOCUMENTS

| | | |
|---|---|---|
| JP | 2004-134471 A | 4/2004 |
| JP | 2007-053331 A | 3/2007 |
| JP | 2009-224478 A | 10/2009 |
| JP | 2013-239653 A | 11/2013 |
| TW | 201703606 A | 1/2017 |
| TW | M556992 | 3/2018 |

OTHER PUBLICATIONS

Japanese Office Action dated Nov. 1, 2018 for Japanese Patent Application No. 2018-103997, 4 pages.

\* cited by examiner

LAYOUT STRUCTURE OF FLEXIBLE CIRCUIT BOARD

FIELD OF THE INVENTION

This invention relates to a flexible circuit board, and more particularly relates to a layout structure of a flexible circuit board.

BACKGROUND OF THE INVENTION

In chip on film (COF) package technology, a chip is flipped and bonded to a thin film, and each of bumps on the chip is connected to each of leads on the thin film. The chip is electrically connected to the thin film via the bumps for direct signal transmission, so can reduce the size of the whole package significantly. Owing to the thin film is made of flexible material, the thin film is also called as flexible substrate or flexible circuit board. With the advance of science and technology, conventional flexible circuit board has developed into fine pitch level (pitch is between about 20 μm and about 30 μm).

During the flexible circuit board developing toward super fine pitch level (pitch is between about 10 μm and about 20 μm), several problems need to be solved. Super fine pitch may cause the reduction of lead width due to etching process limitation, and the width reduction may generate insufficient bonding strength between the leads and the flexible substrate because of insufficient contact area. Furthermore, the flexible substrate heated in the bonding process may be expand to cause lead peeling from the flexible substrate or bonding shift between the corresponding bumps and leads.

SUMMARY

An object of the present invention is to utilize curved parts of leads to increase bonding strength between leads and flexible substrate so that bump shift or leads peeling from flexible substrate is preventable during the heat bonding procedure for bump bonding.

A layout structure of a flexible circuit board includes a flexible substrate and a plurality of leads formed on a surface of the flexible substrate. A chip is flipped on a chip disposition area of the surface. Each of the leads has a bump connection end and a curved part. The bump connection ends are located on the chip disposition area and electrically connected to a plurality of bumps of the chip. A distance ranging from 20 μm to 110 μm exists between each of the curved parts and an edge of each of the bumps. A straight-line distance between a first connection point and a second connection point of the curved part is less than a length of the curved part.

In the present invention, the curved parts of the leads are designed to increase the contact area between the leads and the flexible substrate in order to increase the bonding strength between the bump connection ends of the leads and the flexible substrate, so can prevent the leads from peeling during heat bonding procedure.

DETAILED DESCRIPTION OF THE INVENTION

Figure 1:
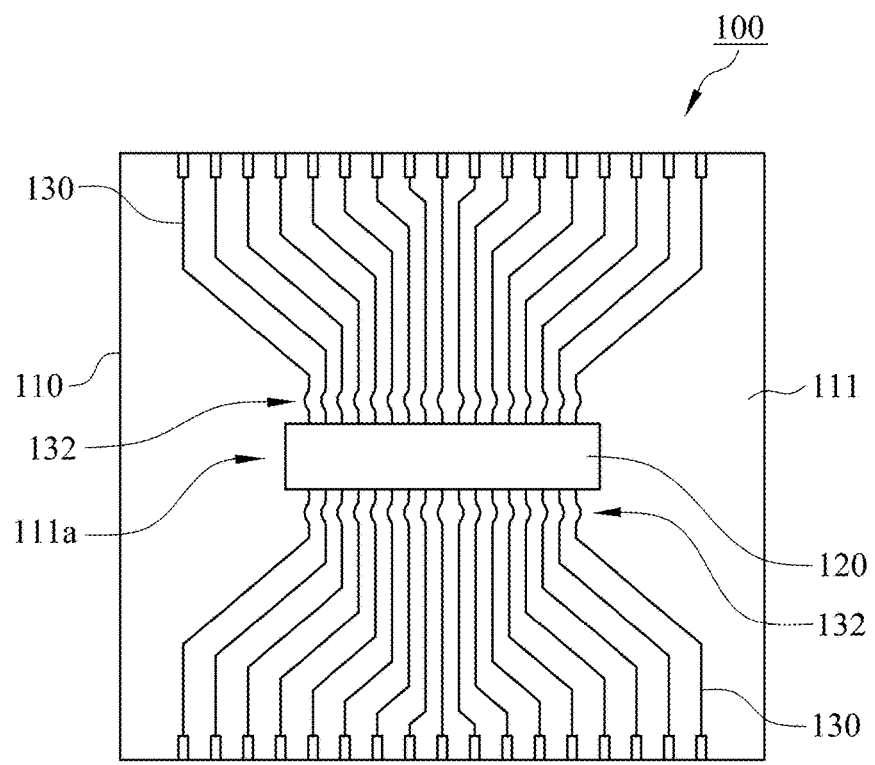
FIG. 1 is a schematic diagram illustrating a layout structure of flexible circuit board in accordance with first embodiment of the present invention.
Figure 2:
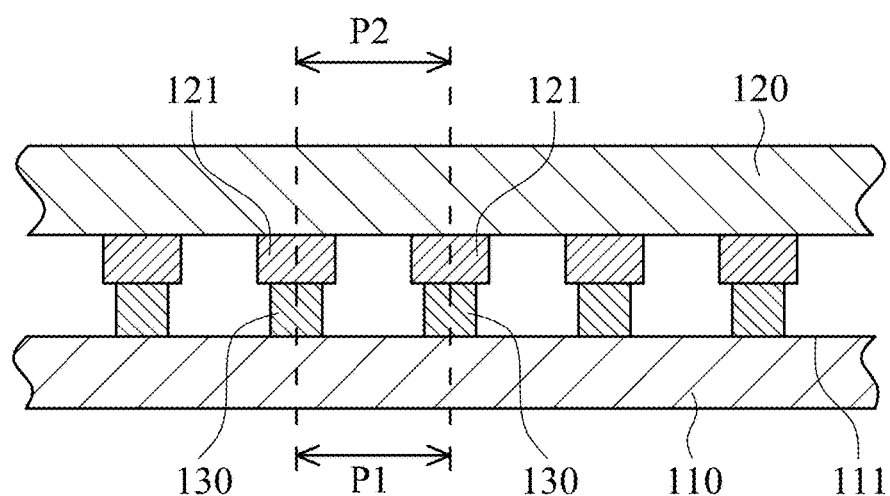
FIG. 2 is a lateral view diagram illustrating the layout structure of flexible circuit board with the first embodiment of the present invention.
Figure 3:
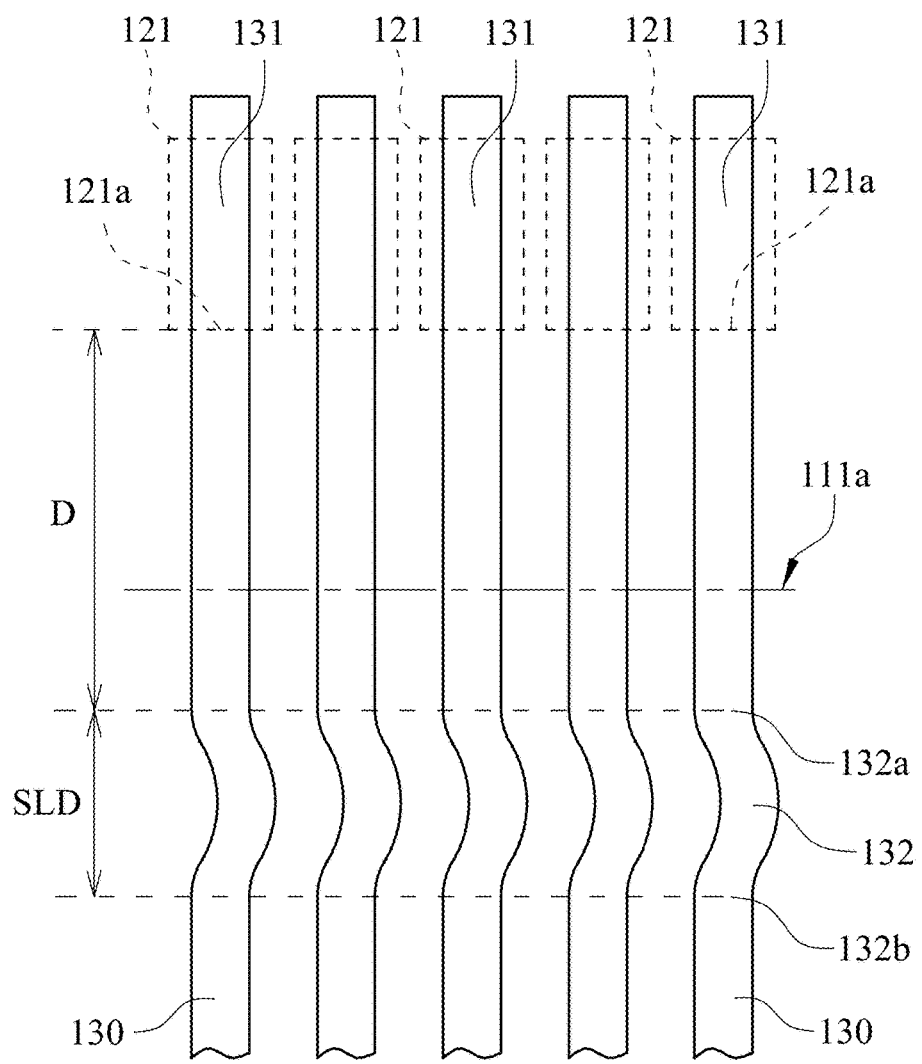
FIG. 3 is a partial schematic diagram illustrating the layout structure of flexible circuit board with the first embodiment of the present invention.

FIG. 1 is a schematic diagram representing first embodiment of the present invention. A layout structure of flexible circuit board 100 includes a flexible substrate 110 having a surface 111 for disposing components, a chip 120 and a plurality of leads 130. The chip 120 and the leads 130 are disposed on the surface 111 of the flexible substrate 110. With reference to FIGS. 1, 2 and 3, the chip 120 is flipped on a chip disposition area 111a of the surface 111 in the first embodiment, and each of the leads 130 has a bump connection end 131 which is located on the chip disposition area 111a and electrically connected to the chip 120. The chip 120 includes a plurality of bumps 121, and each of the bumps 121 is provided to connect with the bump connection end 131 of each of the leads 130. Consequently, the chip 120 can be electrically connected to the bump connection end 131 of each of the leads 130 via each of the bumps 121 for signal transmission between the chip 120 and the leads 130 on the flexible substrate 110.

In the first embodiment, the flexible substrate 110, the chip 120 and the leads 130 are composed of a chip on film (COF) package. The flexible substrate 110 is made of polyimide (PI), the leads 130 are made of copper (Cu) and the bumps 121 are made of gold (Au), copper (Cu), silver (Ag), nickel (Ni), tin (Sn) or an alloy thereof.

With reference to FIG. 2, a pitch P1 between the adjacent leads 130 preferably ranges from 10 μm to 20 μm such that the COF package belongs to super fine pitch level. Otherwise, a pitch P2 between the adjacent bumps 121 is substantially equal to the pitch P1 between the adjacent leads 130 because the leads 130 and the bumps 121 are connected mutually.

With reference to FIG. 3, the chip 120 or the chip disposition area 111a of the flexible substrate 110 is pressed and heated by a pressing and heating device (not shown) in heat bonding step of flip-chip process, such that each of the bumps 121 on the chip 120 can be eutectic bonded with the bump connection end 121 of each of the leads 130. However, the flexible substrate 110 may expand slightly because of heat generated in heat bonding step and the bonding strength between the leads 130 and the flexible substrate 110 may be affected. In the first embodiment, the bumps 121 are arranged in a straight line on the chip 120 and each of the leads 130 includes a curved part 132. A distances D between an edge 121a of each of the bumps 121 and each of the curved parts 132 are substantially identical. The distance D between the curved part 132 and the edge 121a of each of the bumps 121 is 90 μm to 110 μm, and the region between the curved part 132 and the edge 121a of the bump 121 may be heated during the heat bonding step. The curved part 132 has a first connection point 132a and a second connection point 132b, and a straight-line distance SLD between the first connection point 132a and the second connection point 132b is less than the length of the curved part 132. Consequently, the bonding strength between the flexible substrate 110 and the leads 130 near the chip disposition area 111a can be increased to prevent the leads 130 from peeling from the flexible substrate 110. In the first embodiment, the straight-line distance SLD is between 25 µm and 65 µm.

Figure 4:
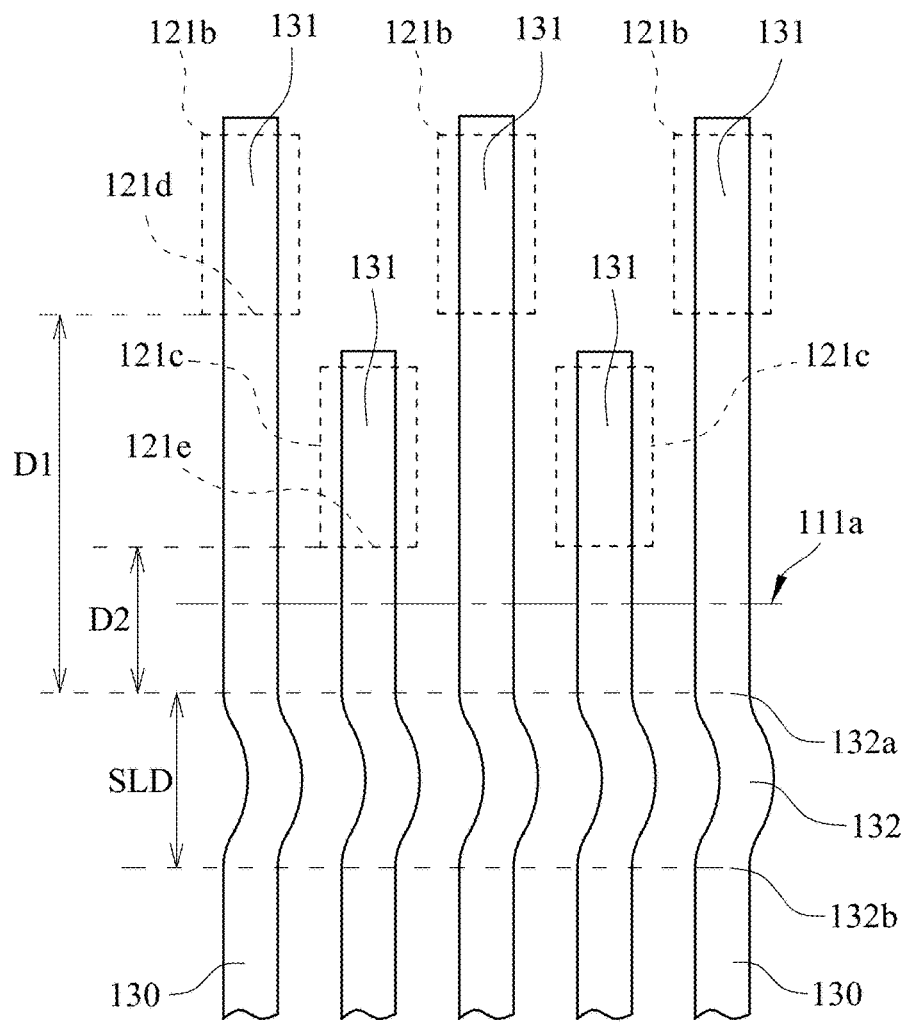
FIG. 4 is a partial schematic diagram illustrating a layout structure of flexible circuit board with second embodiment of the present invention.

FIG. 4 is a partial schematic diagram of second embodiment of the present invention. The arrangement of the bumps 121 is staggered which is different from the bumps 121 in the first embodiment. In other words, the positions of the adjacent bumps 121 are staggered so the bump 120 and the leads 130 can be arranged more closely. In the second embodiment, the bumps 121 involve a plurality of first bumps 121b and a plurality of second bumps 121c. A first distance D1 ranging from 90 µm to 110 µm exists between a first edge 121d of each of the first bumps 121b and the curved part 132, and a second distance D2 ranging from 20 µm to 30 µm exists between a second edge 121e of each of the second bumps 121c and the curved part 132. Identically, the curved part 132 in the second embodiment also can enhance the bonding strength between the leads 130 and the flexible substrate 110 for preventing the leads 130 from peeling from the flexible substrate 110.

The curved parts 132 of each of the leads 130 are provided to increase the contact area between the leads 130 and the flexible substrate 110. As a result, the bonding strength between the bump connection ends 131 of each of the leads 130 and the flexible substrate 110 can be increased and the peeling of the leads 130 can be prevented during heat bonding procedure.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A layout structure of flexible circuit board comprising:
   a flexible substrate having a surface, a chip is flipped on a chip disposition area of the surface; and
   a plurality of leads formed on the surface of the flexible substrate, each of the leads has a bump connection end and a curved part, the bump connection ends are located on the chip disposition area and electrically connected to a plurality of bumps of the chip, and a distance ranging from 20 µm to 110 µm exists between each of the curved parts and a edge of each of the bumps, wherein a straight-line distance between a first connection point and a second connection point of the curved part is less than a length of the curved part.

2. The layout structure of flexible circuit board in accordance with claim 1, wherein the straight-line distance is between 25 µm and 65 µm.

3. The layout structure of flexible circuit board in accordance with claim 1, wherein the flexible substrate is made of polyimide.

4. The layout structure of flexible circuit board in accordance with claim 1, wherein the leads are made of copper.

5. The layout structure of flexible circuit board in accordance with claim 1, wherein the bumps are made of gold, copper, silver, nickel, tin or an alloy thereof.

6. The layout structure of flexible circuit board in accordance with claim 1, wherein a pitch between the adjacent leads is between 10 µm and 20 µm.

7. The layout structure of flexible circuit board in accordance with claim 1, wherein a pitch between the adjacent bumps is substantially equal to the pitch between the adjacent leads.

8. The layout structure of flexible circuit board in accordance with claim 6, wherein a pitch between the adjacent bumps is substantially equal to the pitch between the adjacent leads.

9. The layout structure of flexible circuit board in accordance with claim 1, wherein the bumps are arranged in a straight line on the chip, and the distances between the edge of the bumps and the curved parts are substantially identical, and wherein the distance is between 90 µm and 110 µm.

10. The layout structure of flexible circuit board in accordance with claim 9, wherein the bumps are made of gold, copper, silver, nickel, tin or an alloy thereof.

11. The layout structure of flexible circuit board in accordance with claim 1, wherein the bumps are arranged staggered on the chip and involve a plurality of first bumps and a plurality of second bumps, a first distance exists between a first edge of each of the first bumps and the curved part and a second distance exists between a second edge of each of the second bumps and the curved part, wherein the first distance is between 90 µm and 110 µm, and the second distance is between 20 µm and 30 µm.

12. The layout structure of flexible circuit board in accordance with claim 11, wherein the bumps are made of gold, copper, silver, nickel, tin or an alloy thereof.

* * * * *